US008329514B2

(12) United States Patent  (10) Patent No.: US 8,329,514 B2
Min et al.  (45) Date of Patent: Dec. 11, 2012

(54) METHODS FOR FORMING ANTIFUSES WITH CURVED BREAKDOWN REGIONS

(75) Inventors: Won Gi Min, Chandler, AZ (US); Geoffrey W. Perkins, Chandler, AZ (US); Kyle D. Zukowski, Scottsdale, AZ (US); Jiang-Kai Zuo, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/221,695

(22) Filed: Aug. 30, 2011

(65) Prior Publication Data

US 2011/0312175 A1  Dec. 22, 2011

Related U.S. Application Data

(62) Division of application No. 12/392,641, filed on Feb. 25, 2009, now Pat. No. 8,049,299.

(51) Int. Cl.
  *H01L 21/82* (2006.01)
(52) U.S. Cl. .............. 438/131; 438/600; 257/E21.591
(58) Field of Classification Search ............ 438/131, 438/600; 257/E21.591
  See application file for complete search history.

(56) References Cited

U.S. PATENT DOCUMENTS

| 3,634,927 | A | * | 1/1972 | Neale et al. | 438/385 |
|---|---|---|---|---|---|
| 3,634,929 | A | * | 1/1972 | Yoshida et al. | 438/131 |
| 3,787,822 | A | * | 1/1974 | Rioult | 365/104 |
| 4,665,295 | A | * | 5/1987 | McDavid | 219/121.85 |
| 4,670,970 | A | * | 6/1987 | Bajor | 438/467 |
| 4,751,197 | A | * | 6/1988 | Wills | 438/600 |
| 4,924,294 | A | * | 5/1990 | Tanielian | 257/751 |
| 5,057,451 | A | * | 10/1991 | McCollum | 438/448 |
| 5,100,827 | A | * | 3/1992 | Lytle | 438/467 |
| 5,171,715 | A | * | 12/1992 | Husher et al. | 438/600 |
| 5,242,851 | A | * | 9/1993 | Choi | 438/215 |
| 5,250,459 | A | * | 10/1993 | Lee | 438/600 |

(Continued)

FOREIGN PATENT DOCUMENTS

KR  1020010005306 A  1/2001

OTHER PUBLICATIONS

PCT Application No. PCT/US2010/022835; Search Report and Written Opinion dated Sep. 27, 2010.

*Primary Examiner* — Mary Wilczewski
(74) *Attorney, Agent, or Firm* — Ingrassia Fisher & Lorenz, P.C.

(57) ABSTRACT

Methods are disclosed for forming an antifuse that includes first and second conductive regions having spaced-apart curved portions, with a first dielectric region therebetween, forming in combination with the curved portions a curved breakdown region adapted to switch from a substantially non-conductive initial state to a substantially conductive final state in response to a predetermined programming voltage. A sense voltage less than the programming voltage is used to determine the state of the antifuse as either OFF (high impedance) or ON (low impedance). A shallow trench isolation (STI) region is desirably provided adjacent the breakdown region to inhibit heat loss from the breakdown region during programming. Lower programming voltages and currents are observed compared to antifuses using substantially planar dielectric regions. In a further embodiment, a resistive region is inserted in one lead of the antifuse with either planar or curved breakdown regions to improve post-programming sense reliability.

17 Claims, 8 Drawing Sheets

U.S. PATENT DOCUMENTS

| | | | |
|---|---|---|---|
| 5,308,795 A * | 5/1994 | Hawley et al. | 438/600 |
| 5,610,084 A * | 3/1997 | Solo de Zaldivar | 438/600 |
| 5,639,684 A * | 6/1997 | Kwok | 438/600 |
| 5,756,367 A * | 5/1998 | Mehta | 438/467 |
| 6,124,193 A | 9/2000 | Hawley et al. | |
| 6,218,722 B1 | 4/2001 | Cervin-Lawry et al. | |
| 6,242,335 B1 * | 6/2001 | Sher et al. | 438/600 |
| 6,285,068 B1 | 9/2001 | Kang et al. | |
| 6,307,249 B1 | 10/2001 | Sher et al. | |
| 6,387,792 B2 * | 5/2002 | Lehr et al. | 438/600 |
| 6,388,305 B1 | 5/2002 | Bertin et al. | |
| 6,794,726 B2 | 9/2004 | Radens et al. | |
| 6,972,220 B2 | 12/2005 | Bertin et al. | |
| 7,033,867 B2 | 4/2006 | Porter | |
| 7,037,788 B2 | 5/2006 | Ito et al. | |
| 7,115,493 B2 * | 10/2006 | Forbes et al. | 438/600 |
| 7,157,782 B1 | 1/2007 | Shih et al. | |
| 7,256,471 B2 | 8/2007 | Min et al. | |
| 7,276,775 B2 | 10/2007 | Bertin et al. | |
| 7,615,813 B2 | 11/2009 | Fukuzumi et al. | |
| 7,833,860 B2 | 11/2010 | Kreipl | |
| 7,880,266 B2 | 2/2011 | Park et al. | |
| 7,977,766 B2 * | 7/2011 | Booth et al. | 257/530 |
| 8,049,299 B2 * | 11/2011 | Min et al. | 257/530 |
| 2002/0163019 A1 * | 11/2002 | Mohsen | 257/209 |
| 2003/0104685 A1 * | 6/2003 | Reinberg | 438/597 |
| 2004/0065941 A1 | 4/2004 | Marr | |
| 2005/0258482 A1 | 11/2005 | Ito et al. | |
| 2006/0231922 A1 | 10/2006 | Marr et al. | |
| 2006/0292754 A1 | 12/2006 | Min et al. | |
| 2008/0017858 A1 | 1/2008 | Hsu et al. | |
| 2008/0224261 A1 | 9/2008 | Hsu et al. | |
| 2008/0246098 A1 | 10/2008 | Kurjanowicz | |
| 2008/0258217 A1 | 10/2008 | Chen | |
| 2009/0008741 A1 | 1/2009 | Okayama | |
| 2009/0052221 A1 | 2/2009 | Ogawa | |
| 2009/0102014 A1 | 4/2009 | Borot et al. | |
| 2009/0230448 A1 | 9/2009 | Nishimura et al. | |
| 2010/0213570 A1 * | 8/2010 | Min et al. | 257/530 |
| 2010/0230781 A1 * | 9/2010 | Booth et al. | 257/530 |
| 2010/0276742 A1 | 11/2010 | Voshell et al. | |
| 2011/0312175 A1 * | 12/2011 | Min et al. | 438/600 |

* cited by examiner

METHODS FOR FORMING ANTIFUSES WITH CURVED BREAKDOWN REGIONS

RELATED APPLICATION

This application is a divisional of co-pending, U.S. patent application Ser. No. 12/392,641, filed on Feb. 25, 2009.

TECHNICAL FIELD

The present invention generally relates to electronic devices, more particularly, electronic devices whose conductivity may be altered from relatively high impedance to relatively low impedance state by an electrical signal, which state persists after the electrical signal is removed.

BACKGROUND

The term "fuse" is used in the art to identify a device that initially (before) has low impedance and, when exposed to a current above a predetermined threshold, switches to a high impedance final (after) state. In its simplest embodiment, a small section of conductor melts when exposed to excess current, thereby interrupting the circuit of which it is a part. The term "antifuse" is used in the art to describe a device whose behavior is substantially the opposite of a fuse, that is, it initially (before) has high impedance and, when exposed to a voltage above a predetermined threshold, switches to a low impedance final (after) state. In its simplest embodiment, a thin insulating dielectric sandwiched between two conductors breaks down when exposed to a "programming" voltage above a predetermined threshold, thereby forming a conductive path through the dielectric so that the device thereafter exhibits much lower final impedance. With an antifuse, it is not necessary that the initial and final impedances be infinity and zero, respectively, only that they are substantially different. Accordingly, as used herein with respect to antifuses, the terms "open" or "OFF" and "closed" or "ON" are intended to refer, respectively, to the initial high impedance state and the final lower impedance state and not to imply that these states have infinite and zero impedance.

Antifuses are much used in modern electronics, especially in connection with integrated circuits (ICs), to provide substantially non-volatile memory. For example, an array of antifuses may be programmed during or after manufacture of an electronic circuit to store certain information or commands within the electronic circuit or the memory portion thereof. The stored information may be an identifying serial number or other unique label, or may be the binary code for a software routine, or may determine which parts of a particular circuit are active, or what conversion factor should be used in a calculation or any number of other functions where non-volatile memory or state information is needed.

It is important that the antifuse be easy to manufacture, be reliable in operation, be easily and reliably programmed and consistently sensed, and at the same time be compatible with the other elements that may be part of the same circuit or device, especially when they are manufactured together as for example in an integrated circuit (IC) or other common electronic assembly. It is known to use planar metal-oxide-semiconductor (MOS) structures to form antifuses. These are attractive because they can be formed by the same manufacturing technology used for forming associated metal-oxide-semiconductor-field-effect-transistors (MOSFETs) in complex ICs. However, difficulties still remain in obtaining antifuses of optimum properties using manufacturing technologies compatible with the active devices needed for the IC of which both are a part. Accordingly, there is an ongoing need for improved antifuse structures and manufacturing methods compatible with advanced integrated circuit (IC) technology.

BRIEF DESCRIPTION OF THE DRAWINGS

The present invention will hereinafter be described in conjunction with the following drawing figures, wherein like numerals denote like elements, and wherein.

DETAILED DESCRIPTION

Figure 1:
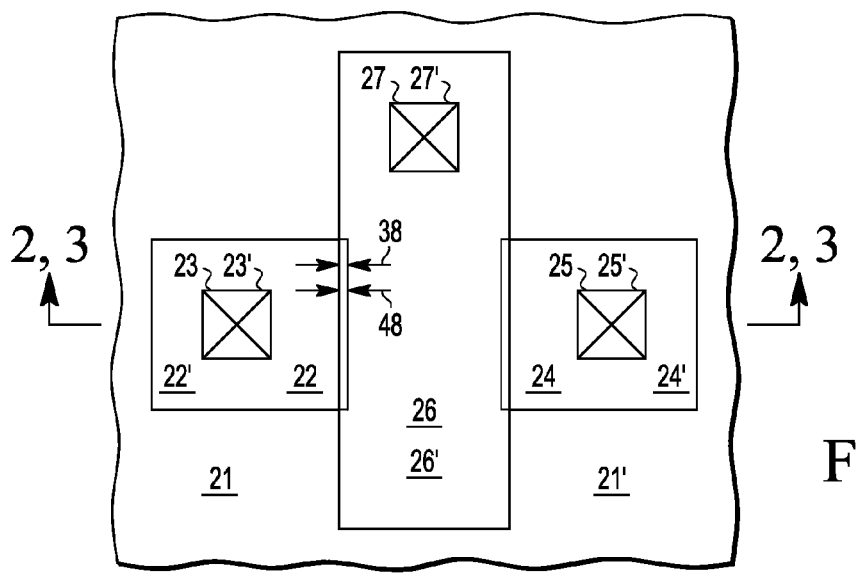
FIG. 1 is a simplified schematic plan view of a metal-oxide-semiconductor (MOS) type antifuse.

The following detailed description is merely exemplary in nature and is not intended to limit the invention or the application and uses of the invention. Furthermore, there is no intention to be bound by any expressed or implied theory presented in the preceding technical field, background, or the following detailed description.

For simplicity and clarity of illustration, the drawing figures illustrate the general manner of construction, and descriptions and details of well-known features and techniques may be omitted to avoid unnecessarily obscuring the invention. Additionally, elements in the drawings figures are not necessarily drawn to scale. For example, the dimensions of some of the elements or regions in the figures may be exaggerated relative to other elements or regions to help improve understanding of embodiments of the invention.

The terms "first," "second," "third," "fourth" and the like in the description and the claims, if any, may be used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Furthermore, the terms "comprise," "include," "have" and any variations thereof, are intended to cover non-exclusive inclusions, such that a process, method, article, or apparatus that comprises a list of elements or steps is not necessarily limited to those elements or steps, but may include other elements or steps not expressly listed or inherent to such process, method, article, or apparatus. The term "coupled," as used herein, is defined as directly or indirectly connected in an electrical or non-electrical manner.

The terms metal-oxide-semiconductor" and "metal-oxide-semiconductor-field-effect-transistor" and their respective abbreviations MOS and MOSFET, are used herein in their broadest sense, as has become common in the art. Specifically, the term "metal" should be interpreted broadly to include any type of relatively conductive material. Non limiting examples are various electrically conductive elemental conductors, alloys and mixtures thereof, semi-metals and doped semiconductors. Similarly, the term "oxide" should be interpreted broadly to include any type of insulating material and not merely those containing oxygen. Non-limiting examples are oxides, nitrides, fluorides, combinations thereof and other organic or inorganic insulating materials. The terms "semiconductor" (abbreviated as "SC") and "semiconductor substrate" are intended to include any type of semiconductor, whether organic or inorganic, to encompass type IV, type III-V and type II-VI materials and to encompass amorphous, polycrystalline and single crystal materials and combinations thereof, as well as composite or layered arrangements such as for example and not intended to be limiting, semiconductor-on-insulator (SOI) structures. Various embodiments are described herein for silicon semiconductors, but persons of skill in the art will understand that this is merely for convenience of explanation and not intended to be limiting and that any semiconductor material can be used, including those enumerated above.

FIG. 1 is a simplified schematic plan view of metal-oxide-semiconductor (MOS) type antifuse 20. Antifuse 20 comprises semiconductor substrate 21, 21' in which are formed doped SC regions 22, 22'; 24, 24' and with respective ohmic contacts 23, 23'; 25, 25'. Located over substrate 21, 21' at substantially right angles to doped SC regions 22, 22'; 24, 24' is conductor 26, 26' with ohmic contact 27, 27'. Reference numbers without prime (') marks are intended to correlate with antifuse 30 of FIG. 2 and reference numbers with prime (') marks are intended to correlate with antifuse 40 of FIG. 3. As can be seen more easily in FIGS. 2 and 3, conductor 26, 26' is separated from substrate 21, 21' and doped SC regions 22, 22'; 24, 24' by one or more insulating regions. Silicon is a suitable material for semiconductor substrate 21, 21' but other SC material may also be used.

Figure 2:
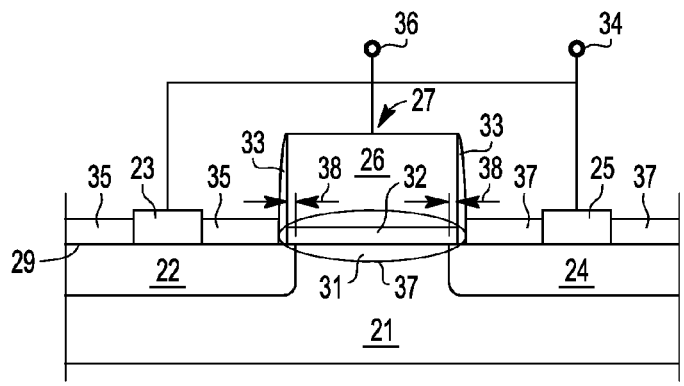
FIG. 2 is a simplified schematic cross-sectional view of an antifuse corresponding to FIG. 1, but according to the prior art.

FIG. 2 is a simplified schematic cross-sectional view of planar MOSFET type antifuse 30 corresponding to the plan view of FIG. 1, but according to the prior art. Antifuse 30 comprises substrate 21, as for example, a monolithic semiconductor of a first conductivity type, in which have been formed doped regions 22, 24 typically but not always of a second, opposite, conductivity type extending to surface 29 of substrate 21. Doped regions 22, 24 are spaced apart by channel region 31. Overlying channel regions 31 on surface 29 is gate dielectric 32, typically silicon oxide. Gate conductor 26 of, for example, polycrystalline silicon is provided on dielectric 32 which insulates conductor 26 from substrate 21 and doped regions 22, 24. Dielectric sidewalls 33 are typically provided on the lateral sides of conductor 26. Further dielectric regions 35, 37 may also be provided above doped regions 22, 24 to insure that conductor 26 is insulated from ohmic contacts 23, 25 and doped regions 22, 24. Antifuse 30 has a typical MOSFET configuration and is much used in the art because it can be conveniently fabricated using standard MOSFET IC manufacturing techniques. Doped regions 22, 24 are analogous to source-drain regions, dielectric 32 to a gate oxide region, conductor 26 to a gate. Their respective ohmic contacts are conventional. In an antifuse configuration, contacts 23, 25 are generally tied together and coupled to antifuse terminal 34 and gate conductor 26 is coupled to antifuse terminal 36. When a programming voltage exceeding the breakdown voltage of dielectric 32 is applied between terminals 34, 36, dielectric 32 breaks down somewhere between conductor 26 and doped regions 22, 24 and/or associated channel region 31, and a low impedance conductive path can be established therebetween. When a sense signal is subsequently provided between terminals 34, 36, this low impedance (after) ON-state is observed.

While such structures are widely used because of their small size and compatibility with conventional MOSFET IC manufacturing, their properties are not optimum. For example, in many applications the programming voltage needed to switch the antifuse into its low impedance ON-state is larger than desired. In other applications, the programming current can be larger than desired, thereby requiring larger drive circuits. In still other applications, especially where large parallel arrays of antifuses are employed that need to be programmed simultaneously, the higher than desired programming current can lead to unreliable programming of antifuses further into the array. The voltage drop associated with the program current in the longer programming leads can cause the programming voltage that appears at these further-in antifuses to be too low for reliable programming and such further-in antifuses may fail to program or may have higher than desired post programming ON resistance. These and other difficulties can contribute to less than desired functionality and/or reliability. It has been found that the programming voltage and current can be reduced, and the programming and post-programming functionality and/or reliability improved by providing a different structure and modified manufacturing methods that are still compatible with modern day IC manufacturing technology.

Figure 3:
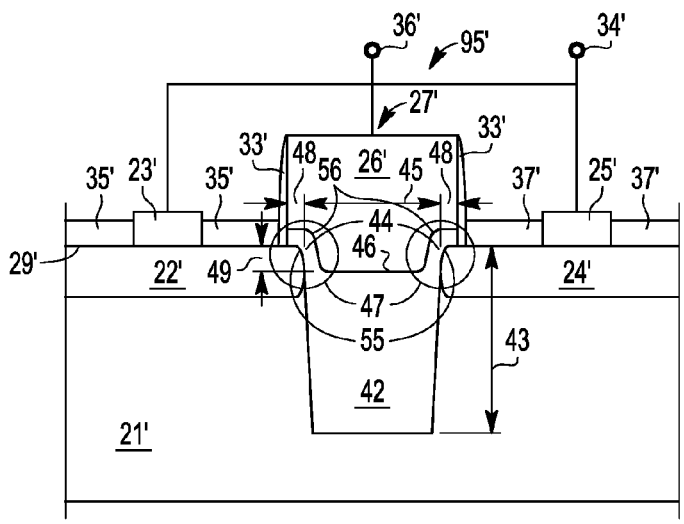
FIG. 3 is a simplified schematic cross-sectional view of an antifuse corresponding to FIG. 1, but according to an embodiment of the present invention.

FIG. 3 is a simplified schematic cross-sectional view of antifuse 40 corresponding to FIG. 1, but according to an embodiment of the present invention. Antifuse 40 comprises substrate 21', as for example, a monolithic semiconductor of a first conductivity type, in which have been formed doped regions 22', 24' extending to surface 29' of substrate 21'. Doped regions 22', 24' may be of the same conductivity type or of opposite conductivity type than substrate 21'. Either arrangement is useful. Doped regions 22', 24' are analogous to doped regions 22, 24 of FIG. 2 and can be formed at the same time as the source-drain regions of MOSFETs or other devices making up the chip or IC of which antifuse 40 can be a part. Antifuse 40 may also be part of an independent antifuse array rather than part of an IC containing other electronic functions. Doped regions 22', 24' are spaced apart by shallow trench isolation (STI) region 42 of depth 43 and width 45. Silicon oxide is a convenient dielectric for forming STI region 42. Central portion 46 of STI region 42 is depressed by amount 49 below the level of surface 29' of substrate 21' and has thin dielectric regions or lips 44 adjacent regions 22', 24' near where STI region 42 meets surface 29'. Conductor 26', e.g., of doped polysilicon, overlies central portion 46 of STI region 42 and thin dielectric regions or lips 44 that insulate gate conductor 26' from doped regions 22', 24'. It is within these thin dielectric regions or lips 44 within circles 47 between curved surfaces 55, 56 of doped regions 22', 24' and conductor 26', respectively, that breakdown (switching) of antifuse 40 preferentially takes place. For this reason circles 47 are also referred to as "breakdown regions" 47. Dielectric sidewalls 33' analogous to dielectric sidewalls 33 of FIG. 2 are typically provided on lateral sides of conductor 26'. Further dielectric regions 35', 37' analogous to regions 35, 37 of FIG. 2 may also be provided above doped regions 22', 24' to insure that conductor 26' is insulated from ohmic contacts 23', 25' and doped regions 22', 24'.

Figure 4:
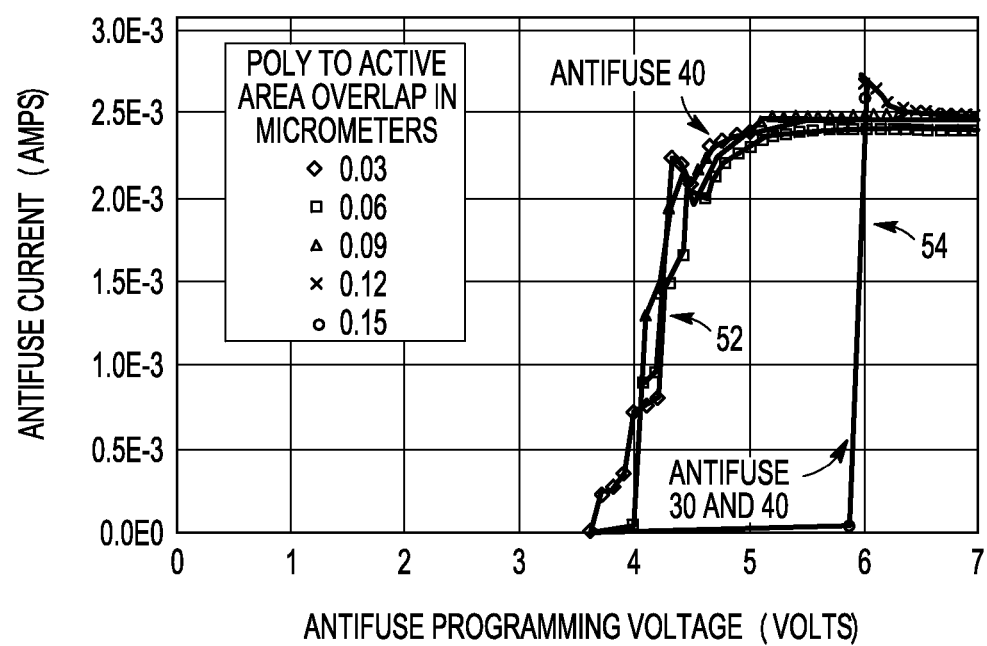
FIG. 4 is a plot of antifuse current versus antifuse voltage comparing the properties of antifuses of the type illustrated in FIGS. 2 and 3.

The geometry of the antifuse 40 constrains dielectric failure to preferentially occur within localized thin dielectric regions 44 encompassed by the circles identified as breakdown regions 47 and provides superior results. By comparison, in prior art antifuse 30 of FIG. 3, dielectric failure can occur anywhere through dielectric 32 within the region identified by broad oval 37. For this reason oval 37 is also referred to as "breakdown region" 37. It is known that Joule heating is an important aspect of electrical breakdown of dielectrics. The highly localized current flowing during electrical breakdown increases the local temperature, which temperature increase furthers the breakdown process. The localized temperature depends upon the difference between the rate of heat generation and the rate at which heat is dissipated to the surrounding material. With prior art antifuse 30 much of the Joule heating occurring during breakdown is lost to substrate 21 because of the relatively large contact area between breakdown region 37 and substrate 21 and the comparatively high thermal conductivity of the semiconductor material of substrate 21. In contrast, the presence of STI region 42 in antifuse 40 reduces the local thermal conductivity in the vicinity of breakdown regions 47 as compared to breakdown region 37 of prior art antifuse 30. For, example, where substrate 21, 21' is of silicon and STI region 42 is of silicon oxide, the thermal conductivity of STI region 42 is approximately two orders of magnitude less than that of substrate 21. By constraining breakdown (e.g., programming) of antifuse 40 to occur within breakdown regions 47 adjacent STI region 42, less heat is dissipated to substrate 21' during programming. This is believed to contribute to the efficient programming of antifuse 40 relative to prior art antifuse 30 since localized Joule heating during the programming process is believed to contribute significantly to the dielectric breakdown associated with programming. If less heat energy is lost to substrate 21' during programming, then programming is more efficient and the required programming energy will be lower. The reduction in programming current obtained for antifuse 40 compared to antifuse 30 is illustrated by the data of Table I below and the reduction in programming voltage is illustrated in FIG. 4. For these devices, the initial (OFF-state) impedance was typically of the order of hundreds of giga-ohms.

| PROGRAM CURRENT VERSUS POST-PROGRAM IMPEDANCE FOR ANTIFUSE 30 OF FIGS. 1 AND 2 AND ANTIFUSE 40 OF FIG. 1 AND 3. | | | | | |
|---|---|---|---|---|---|
| | | Program Current (milliamps) | | | |
| | | 1.2 | 1.5 | 2.0 | 2.5 |
| Post Program Antifuse Resistance (kilo-ohms) | Prior Art MOSFET Antifuse 30 | 12.4 | 8.5 | 6.5 | 3.2 |
| | STI Embedded Antifuse 40 | 6.4 | 4.8 | 4.6 | 3.1 |

It will be noted that STI embedded antifuse 40 provided substantially lower post-programming ON-resistance than prior art MOSFET type antifuse 30 for all except the highest programming currents.

FIG. 4 shows plot 50 of antifuse current versus antifuse programming voltage, for antifuse 40 of the type illustrated in FIGS. 1 and 3. Traces 52 and 54 show the response of STI embedded antifuse 40 of FIGS. 1 and 3 for different values of overlap spacing 48 (see FIG. 3). It was also found that antifuse 30 of FIGS. 1 and 2 showed programming responses corresponding approximately to that of trace 54, and had a programming voltage of about 6 volts. In the case of STI embedded antifuse 40, several structures were tested in which lateral overlap spacing 48 between the lateral edges of poly (gate) 26'and the interior edges of doped regions 22', 24' (e.g., the active areas) was varied. This is referred to as the "poly to active area overlap" in FIG. 4 and the magnitude of this overlap is shown in the data table included in FIG. 4 correlated to the different traces. It was found that for all overlap spacings 48 of about $\leq 0.12$ micrometers, that antifuse 40 had programming voltages in the vicinity of about 4 volts. For overlap spacing 48 of about 0.12 micrometers, the programming voltage varied between about 4 volts and 6 volts and for overlap spacings 48 of about 0.15 micrometers or greater, the programming voltage was about 6 volts, the same as observed for antifuse 30 of FIGS. 1 and 2. Thus, with appropriate choice of overlap spacing 48, antifuse 40 can be switched into the ON-state using lower programming voltages as well as lower programming currents.

Figure 5:
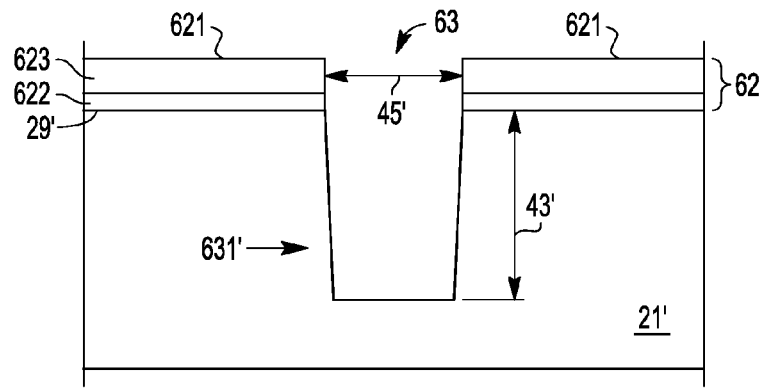
FIGS. 5-12 are simplified schematic cross-sectional views through an antifuse of the type illustrated in FIGS. 1 and 3 at different stages of manufacture, according to further embodiments of the present invention.
Figure 6:
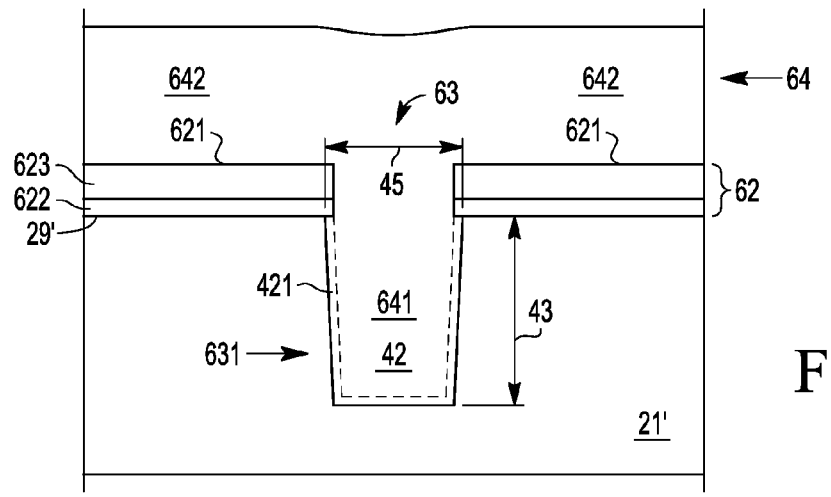
Figure 7:
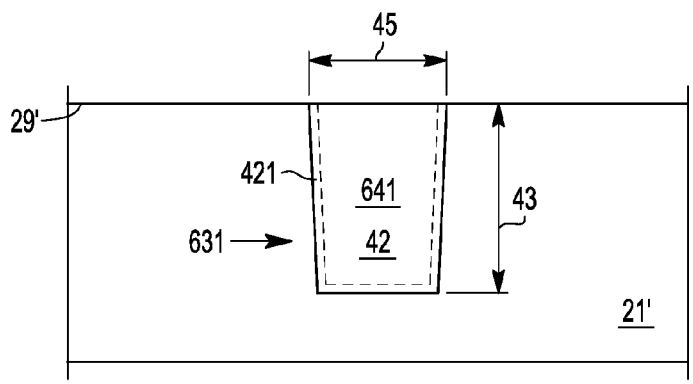

FIGS. 5-12 are simplified schematic cross-sectional views through antifuse 40 of the type illustrated in FIGS. 1 and 3 at different stages 105-112 of manufacture, according to further embodiments of the present invention. Referring now to manufacturing stage 105 of FIG. 5, substrate 21' of, for example and not intended to be limiting, silicon having upper surface 29' is provided. Dielectric layer 62 with upper surface 621 is formed on surface 29'. It is desirable that layer 62 be a double layer with lower portion or layer portion 622 against surface 29' chosen for its compatibility with surface 29' and upper portion or layer 623 chosen for its chemical properties as a mask and/or an etch stop. When substrate 21' is of silicon, layer 622 is preferably silicon oxide and layers 623 is preferably silicon nitride, but other materials well known in the art may also be used. A conventional mask material (not shown) is deposited over surface 621 of layer 62. Opening 63 is provided therein having width 45'. Using opening 63, trench 631' is etched through layer 62 and into substrate 21' to depth 43' beneath surface 29'. Reactive ion etching (RIE) is a preferred means of forming trench 631. Suitable etching reagents for penetrating layer 62 and into substrate 21' will depend upon the exact choice of the materials for layer 62 and substrate 21' and are within the competence of those of skill in the art. Structure 205 results. Referring now to manufacturing stage 106 of FIG. 6, trench 631' of FIG. 5 is filled with shallow trench isolation (STI) dielectric 42. In a preferred embodiment, STI dielectric 42 is formed by first oxidizing the surface of (e.g., silicon) substrate 21' exposed in trench 631' to provide about 10-20 nanometers of silicon dioxide 421 thereon and then filling the trench with deposited dielectric 64. Thus, initial width 45' and depth 43' of trench 631' of FIG. 5, are slightly changed in doing so and designated in FIG. 6 and hereafter as width 45 and depth 43 of trench 631 without prime (') marks on such reference numbers. In the preferred embodiment, the initial oxidation to provide oxide layer 621 is followed by chemical vapor deposition (CVD) of layer 64 to fill the remainder of trench 631 with dielectric portion 641 and provide portions 642 lying above surface 621 of layer 62. Tetra-ethyl-ortho-silicate (TEOS) is useful for providing dielectric layer 64 but other materials well known in the art may also be used. Structure 206 results. In other embodiments, the initial oxidation step and layer 421 may be omitted and trench 631' of FIG. 5 directly filled in manufacturing stage 106 of FIG. 6 with deposited dielectric 64. Either arrangement is useful. For convenience of explanation, it is assumed hereafter such initial oxidation step to form layer 421 is included in manufacturing stage 106 and that structure 206 is used. Referring now to manufacturing stage 107 of FIG. 7, structure 206 is lapped or otherwise treated to remove portions 642 of layer 64 and remaining portions of layer 62 above surface 29' of substrate 21', there by leaving dielectric 421 and 641 in trench 631. Chemical-mechanical polishing (CMP) is a preferred means of removing dielectric portions 62 and 642. Type SS12 CMP slurry provided by the Cabot Company of Aurora, Ill., USA is useful for manufacturing stages 107-108. Structure 207 results. In manufacturing stage 108 of FIG. 8, central portion 46 of dielectric 641 in cavity 631 is recessed slightly, e. g., by distance 49' below surface 29' of substrate 21'. This may be accomplished by a brief etch of (e.g., oxide) dielectric 641 or by briefly continuing the CMP process of manufacturing stage 107 which tends to remove the dielectric of layer 64 more rapidly than the material of substrate 21' resulting in the slight depression illustrated in FIG. 8. Either arrangement works. Structure 208 results.

Figure 8:
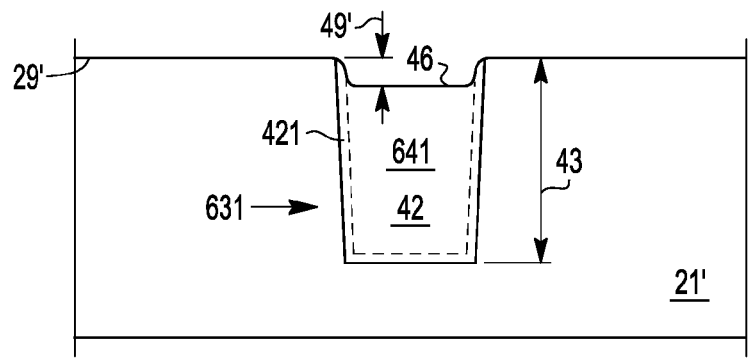
Figure 9:
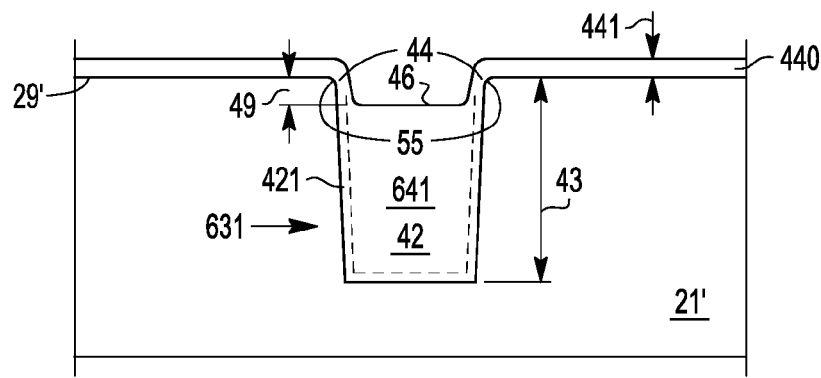
Figure 10:
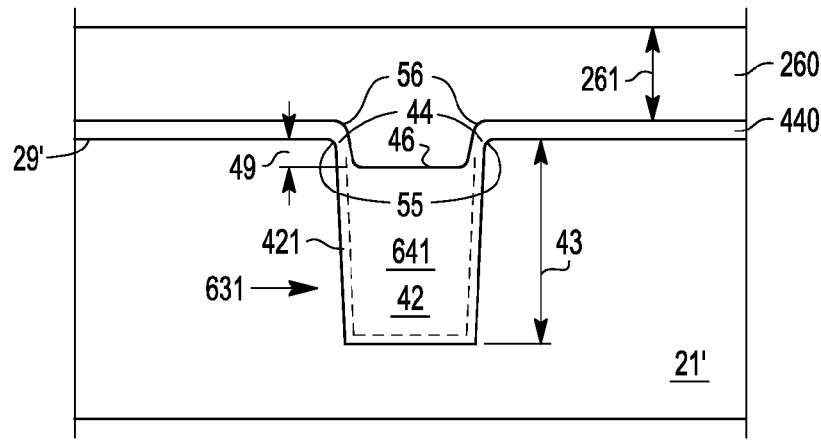

In manufacturing stage 109 of FIG. 9, dielectric layer 440 of thickness 441 is formed on surface 29' of substrate 21'. This may result in a slight change in dimension or depth 49' of FIG. 8 if a small portion of substrate 21' near surface 29' is consumed in the formation of dielectric layer 440. Accordingly, depth 49' of FIG. 8 is henceforth referred to in FIG. 9 and hereafter as depth 49 without the prime (') mark. Depth 49 is usefully in the range of about 1 to 10 nanometers, more conveniently about 2 to 8 nanometers and preferably about 4 to 6 nanometers, but larger and smaller depths may also be used. Layer 440 is preferably formed by thermal oxidation of (e.g., silicon) substrate 21,' but other dielectric formation techniques well known in the art may also be used. Lip portions 44 of dielectric layer 440 are located on curved regions 55 where trench 631 meets surface 29' of substrate 21'. Thickness 441 is usefully in the range of about 1 to 10 nanometers, more conveniently in the range of about 2 to 8 nanometers and preferably in the range of about 2 to 4 nanometers, but larger or smaller values may also be used. Thickness 441 depends on the desired programming voltage, but is often decided based on the available processing steps in the manufacturing sequence used for forming other devices on the same die or IC of which antifuse 40 is to be a part, as for example, and not intended to be limiting, a gate oxide formation step. Structure 209 results wherein STI region 42 of FIG. 3 results from the combination of the remaining portions of dielectric 641 and 421 in trench 631. For convenience of description, reference number 42 is used hereafter to identify this STI region in the various FIGS. Referring now to manufacturing stage 110 of FIG. 10, conductor 260 of thickness 261 is deposited or formed over dielectric layer 440 above substrate 21' including STI region 42. Curved portions 56 of conductor 260 form on thin dielectric regions or lips 440 opposite curved portions 55 of substrate 21'. Polycrystalline silicon is a convenient material for forming conductor 260, but other conductors (e.g., metals) may also be used. Thickness 261 is usefully in the range of about 50 to 500 nanometers, more conveniently in the range of about 100 to 300 nanometers and preferably in the range of about 150 to 200 nanometers, but larger or smaller values may also be used. The gate conductor material useful for other devices on the same die or IC is often suitable. Structure 210 results.

Figure 11:
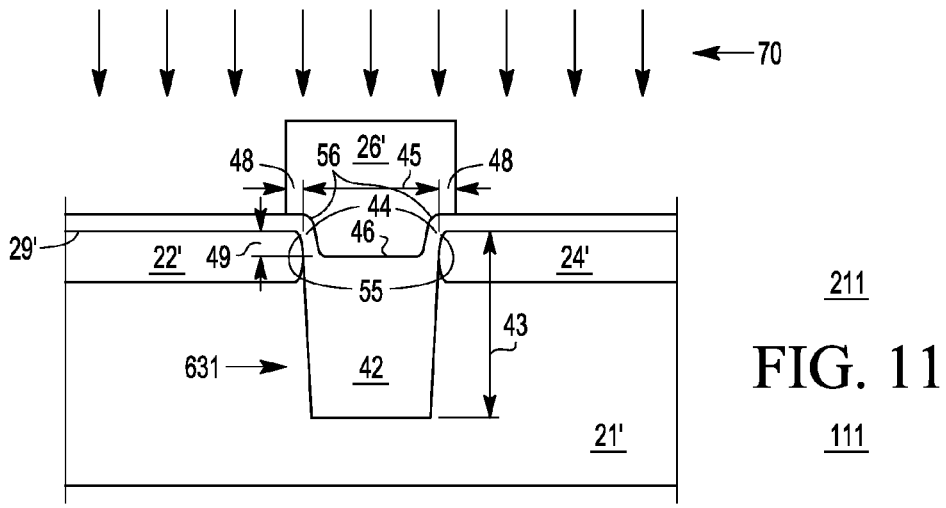
Figure 12:
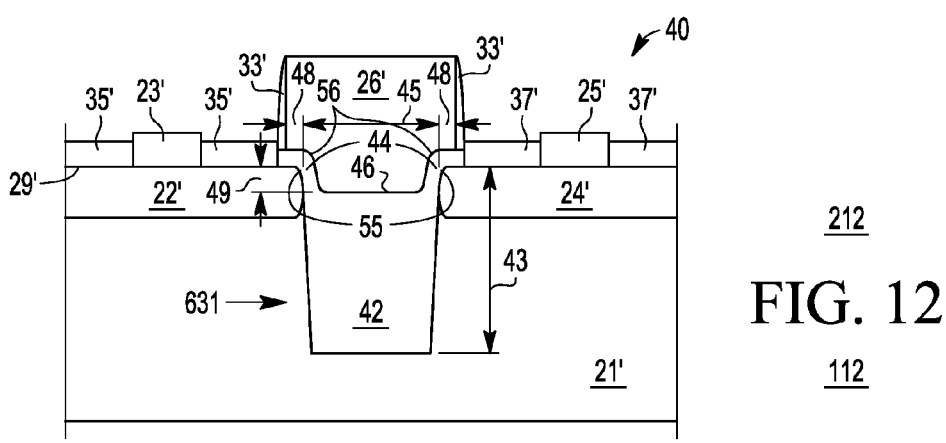

In manufacturing stage 111 of FIG. 11, structure 210 is subjected to a conventional masking and etching steps to define conductor 26' of FIG. 3 from conductor layer 260 and of a lateral size and location so as to have overlap regions of width 48 with respect to underlying STI region 42 and dielectric regions or lips 44. Doped regions 22', 24' are desirably provided on either side of STI region 42. The doping process conventionally used for forming source-drain regions of associated MOSFETS is convenient for forming doped regions 22', 24' and provides doped regions 22', 24' that are self-aligned with respect to conductor 26' and STI region 42. This doping step can also serve to reduce the resistivity of conductor 26'. Ion implantation 70 is preferred for forming doped regions 22', 24' and reducing the resistivity of conductor 26', but other doping means well known in the art may also be used. A brief activation heating step may also be included, depending upon the particular doping method employed. This is understood by those of skill in the art. Structure 211 results. In manufacturing stage 112 of FIG. 12, ohmic contacts 23', 25' and dielectric regions 33', 35', 37' are provided using means well known in the art. Structure 212 results. Connections 34', 36' can also be provided in a conventional manner whereby antifuse 40 of FIG. 3 results. It will be noted that manufacturing stages 105-112 used to form antifuse 40 of FIGS. 3 and 12 are fully compatible with the processing steps generally available for formation of ICs employing MOSFETs and many other types of semiconductor devices. This is a substantial advantage.

Figure 13:
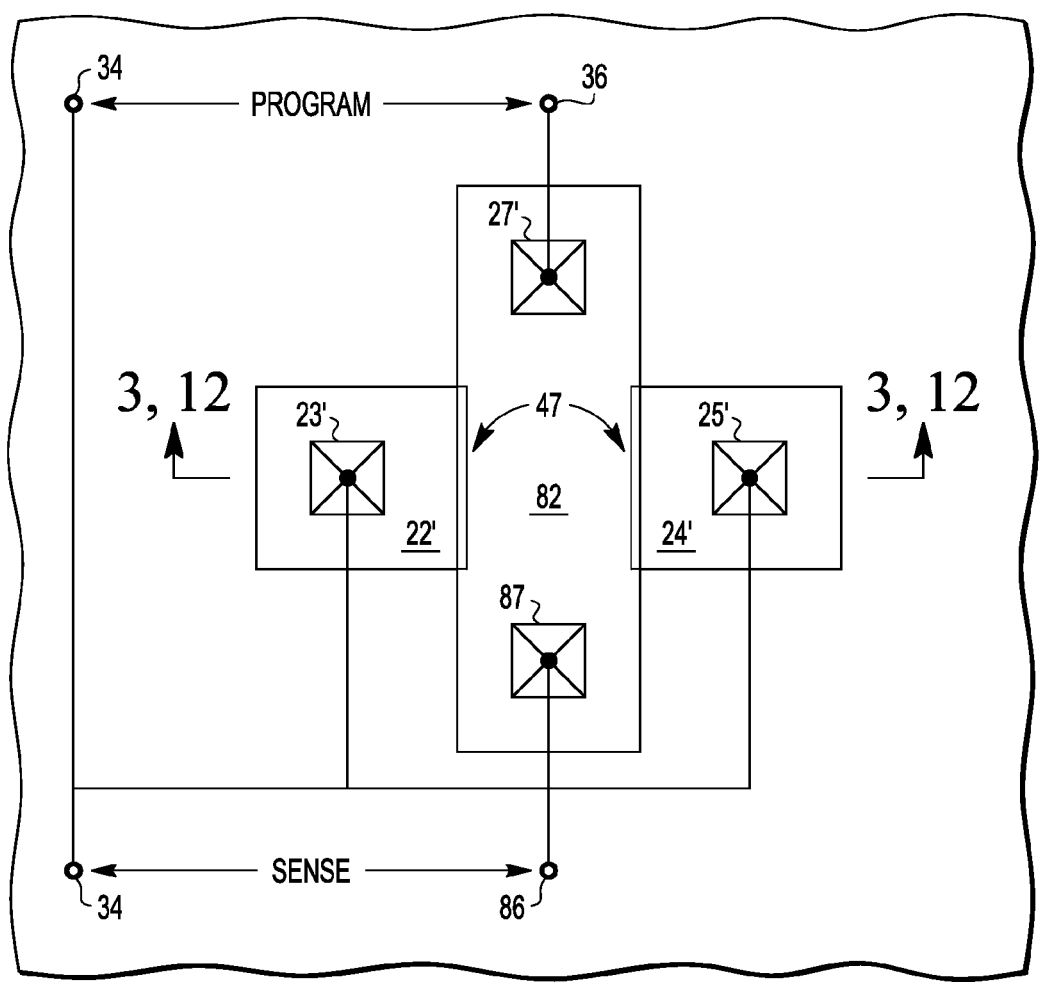
FIG. 13 is a simplified plan view of an antifuse analogous to the antifuse of FIGS. 3 and 12, but according to a further embodiment of the present invention.

FIG. 13 is a simplified plan view of antifuse 80 analogous to antifuse 40 of FIGS. 3 and 12, but according to a further embodiment of the present invention, the discussion of which is incorporated herein by reference. Antifuse 80 differs from antifuse 40 in that conductor 26' is replaced by conductor 82 incorporating ohmic contact 27' of conductor 26' as well as ohmic contact 87. Otherwise the structure and means of formation are substantially the same as described in connection FIGS. 3 and 5-12. As before, ohmic contacts 23', 25' are desirably coupled together and to common terminal 34' and ohmic contact 27' is coupled to terminal 36. Ohmic contact 87 is coupled to terminal 86. This arrangement creates 3-terminal antifuse 80 wherein the programming voltage may be applied, for example, between terminals 34, 36 and the sense voltage may be applied between terminals 34, 86, or vice versa. This has the advantage that the programming and sensing leads to conductor 82 are separated so that damage to the portion of conductor 82 between, for example, contact 27' and breakdown regions 47 adjacent doped regions 22', 24' (see also FIG. 3 or 12) that might occur during programming, does not affect the ability to subsequently sense the state of antifuse 80 using, for example, ohmic contact 87. This is a further advantage.

Figure 14:
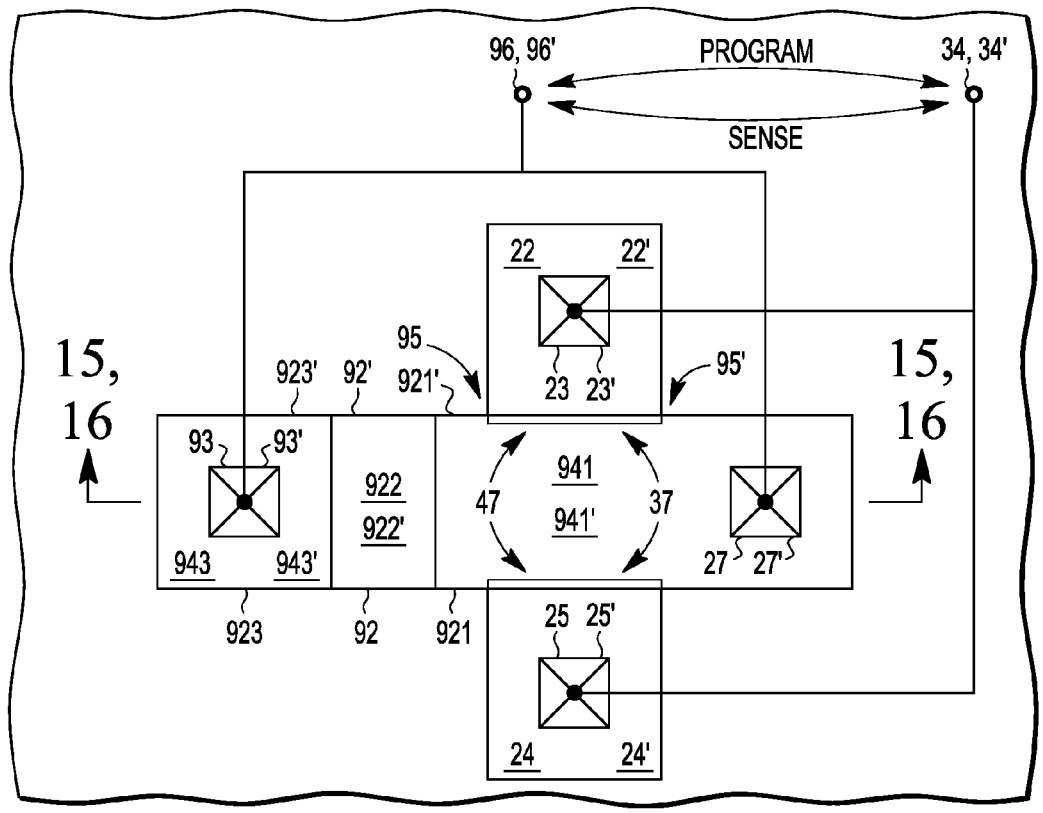
FIG. 14 is a simplified schematic plan view and FIGS. 15 and 16 are simplified schematic cross-sectional views of the antifuses of FIG. 14, according to still further embodiments of the present invention.
Figure 15:
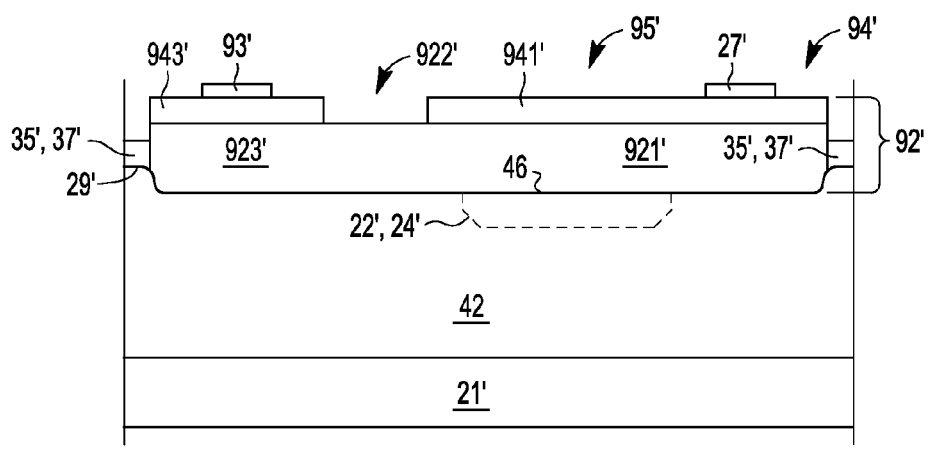
Figure 16:
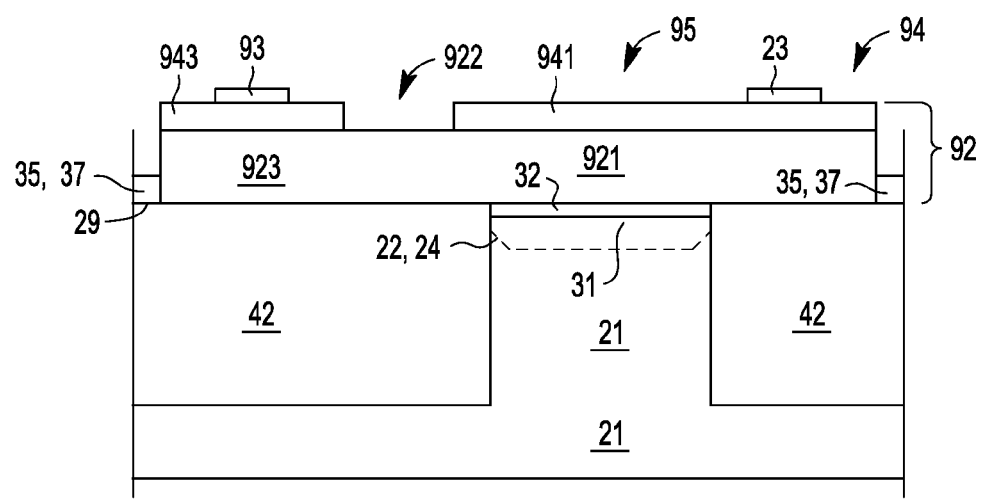

FIG. 14 is a simplified schematic plan view and FIGS. 15 and 16 are simplified schematic cross-sectional views of antifuses 90, 90' according to still further embodiments of the present invention. For convenience of illustration, the plan view of FIG. 14 is rotated approximately ninety degrees compared to the view of FIGS. 1 and 13. Accordingly the cross-sectional view of FIGS. 15 and 16 are also at approximately at ninety degrees compared to the cross-sectional views of FIGS. 1, 2, 3 and 12. FIG. 14 applies to both FIGS. 15 and 16. The combination of FIGS. 14 and 15 is discussed first. Conductor 92' of antifuse 90' of FIGS. 14 and 15 is analogous to conductor 26, 26' of FIGS. 1, 3 and 12 and conductor 82 of FIG. 13, but has a somewhat different extent. The structure in central portion 95' of antifuse 40 beneath conductor 92' is substantially the same as that of antifuse 40 beneath conductor 26' and antifuse 80 beneath conductor 82, and the discussion thereof in connection with FIGS. 3-13 is generally applicable herein. Shallow trench isolation region 42 conveniently underlies those portions of gate conductor 92' over central portion 95' and lying laterally outside of central portion 95' of FIG. 15. Antifuse 90' of FIGS. 14-15 differs from antifuse 40, 80 in that conductor 92' is not uniformly conductive between ohmic contacts 27' and 93'. Conductor 92' has portion 921' that is more conductive, portion 922' that is less conductive and portion 923' that is again more conductive. Stated another way, portion 922' of conductor 92' has a higher resistance than the remainder of conductor 92'. This may be accomplished in several ways. For example: (A) by providing more conductive layer 94' with regions 941', 943' of a much more conductive material above portions 921', 923' while leaving portion 922' without such additional conductor, or (B) omitting conductive layer 94' but masking portion 922' during implant 70 of FIG. 11 so that the conductivity of portion 922' remains as-deposited and is not reduced by implant 70 (which dope unmasked portions 921', 923'), thereby providing region 922' of higher resistivity than adjacent portions 921', 923' of conductor 92', or (C) a combination thereof or by other means. That it is possible to mask implant 70 above portion 922' without interfering with the formation of doped regions 22', 24' is apparent in FIG. 15 whereby the relative location of doped regions 22', 24', which lie before and behind the plane of FIG. 15, are indicated by the dashed line labeled 22', 24'. Ohmic contacts 23', 25', 27' are provided as before, with ohmic contact 27' to regions 921' of conductor 92' or metal conductor portion 941' of more conductive layer 94', and with additional ohmic contact 93' to conductor portion 923' or portion 943' of more conductive layer 94'. Either arrangement is useful. Ohmic contacts 23', 25' are conveniently coupled together and to terminal 34'. Ohmic contacts 27' and 93' can also be coupled together and to terminal 96'. When a programming voltage is applied between terminals 34' and 96', the presence of higher resistance portion 922' in conductor 92' steers the programming current into breakdown regions 47 via contact 27', thereby decreasing the probability of damage to contact 93' and portions 923', 922' of conductor 92' (and associated conductor 943' if present). This leaves contact 93' and portions 923', 922' (and associated conductor 943' if present), less likely to incur damage during programming and therefore more likely to be available when it is desired to subsequently sense the state of antifuse 90' by applying a sense voltage to the same terminals 34', 96'. Thus, the arrangement of antifuse 90' improves the reliability of an antifuse array without the need for a separate third terminal and associated leads into the antifuse array.

Referring now to the arrangement of FIGS. 14 and 16, conductor 92 of antifuse 90 of FIGS. 14 and 16 is analogous to conductor 26 of FIGS. 1 and 2, but has a somewhat different extent. The structure in central portion 95 of antifuse 90 beneath conductor 92 is substantially the same as that of antifuse 30 beneath conductor 26, and the discussion thereof is generally applicable herein. Shallow trench isolation region 42 conveniently underlies those portions of gate conductor 92 lying laterally outside of thin oxide region 32 in FIG. 16. Antifuse 90 of FIGS. 14 and 16 differs from antifuse 30 in that conductor 92 (analogous to conductor 26) is not uniformly conductive. Conductor 92 has portion 921 that is more conductive, portion 922 that is less conductive and portion 923 that is again more conductive. Stated another way, portion 922 of conductor 92 has a higher resistance than the remainder of conductor 92. This may be accomplished in several ways as has already been described in connection with FIGS. 14 and 15, which discussion is generally applicable herein, with primes (') deleted from the reference numbers to correspond to the structure of FIG. 16. The option of providing higher resistance section 922 can also be accomplished by masking in that location during the equivalent implant (e.g., a source-drain implant) normally carried out in forming MOSFET type antifuse 30. Ohmic contacts 23, 25, 27 are provided as before, with ohmic contact 27 to regions 921 of conductor 92 or metal conductor portion 941 of more conductive layer 94, and with additional ohmic contact 93 to conductor portion 923 or portion 943 of more conductive layer 94. Either arrangement is useful. Ohmic contacts 23, 25 are conveniently coupled together and to terminal 34. Ohmic contacts 27 and 93 can also be coupled together and to terminal 96. When a programming voltage is applied between terminals 34 and 96, the presence of higher resistance portion 922 in conductor 92 steers the programming current into breakdown regions 37 (e.g., see also FIG. 2) via contact 27, thereby decreasing the probability of damage to contact 93 and portions 923, 922 of conductor 92 (and associated conductor 943 if present). This leaves contact 93 and portions 923, 922 (and associated conductor 943 if present), less likely to incur damage during programming and therefore more likely to be available when it is desired to subsequently sense the state of antifuse 90 by applying a sense voltage to the same terminals 34, 96. Thus, the arrangement of antifuse 90 can improves the reliability of an array of prior art antifuses 30 without the need for a separate third terminal and associated leads into the antifuse array. Thus, the arrangement of including a third terminal with higher resistance link 922, 922' in one lead thereof may be applied to either prior art type antifuse 30 or improved type antifuse 40. This is a significant advantage.

According to a first embodiment, there is provided an antifuse (40, 80, 90')), comprising first (22', 24') and second (26') conductive regions having spaced-apart curved portions (55, 56), and a first dielectric region (44) separating the spaced-apart curved portions (55, 56), thereby forming in combination with the curved portions (55, 56) a curved breakdown region (47) adapted to switch from a substantially non-conductive state to a substantially conductive state in response to a predetermined applied programming voltage. According to a further embodiment, the first (22', 24') and second (26') conductive regions are doped semiconductor regions. According to a still further embodiment, the second conductive region (26') is a substantially polycrystalline semiconductor region and the first (22', 24') conductive regions are substantially single crystal semiconductor regions. According to a yet further embodiment, a second dielectric region (42) substantially thicker than the first dielectric region (44) is located adjacent the first dielectric region (44) at first ends of the curved portions (55', 56'). According to a still yet further embodiment, the antifuse (40, 80, 90') further comprises a semiconductor substrate (21'), wherein the first conductive regions (22', 24') are formed by doping of the substrate (21') and the first dielectric region (44) is formed by oxidation of the substrate (21'). According to a yet still further embodiment, the second dielectric region (42) comprises a dielectric filled cavity 631, 631') in the substrate (21'). According to another embodiment, the first dielectric region (44) is a thermally grown oxide region. According to a still another embodiment, the second dielectric region (42) comprises a dielectric (641) formed by chemical vapor deposition. According to a yet another embodiment, the second dielectric region (42) comprises a dielectric (421, 641) formed in part by thermal oxidation and in part by deposition.

There is provided a second embodiment, comprising, a method for forming an antifuse (40, 80, 90'), comprising, providing a substrate (21') having an upper surface (29'), forming a cavity (631') extending a predetermined distance (43, 43') into the substrate (21') from the upper surface (29'), filling the cavity (631', 631) with a dielectric (421, 641) having a central region (46) depressed from the upper surface (29'), forming a curved dielectric region (44) on a curved portion (55) of the surface (29') of the substrate (21') adjacent the cavity (631) and extending toward the central region (46), and depositing a conductor (26') having a curved portion (56)

overlying the curved dielectric region (44), thereby forming a breakdown region (47) comprising the curved portion (56) of the conductor (26') and the curved portion (55) of the substrate (21') on either side of the curved dielectric region (44). According to a further embodiment, the curved dielectric region (44) is formed by oxidation of the curved portions (55) the substrate (21'). According to a still further embodiment, the filling step comprises depositing a dielectric (64) into the cavity (631, 631') and over the upper surface (29') and then removing portions (642) of the dielectric (64) over the upper surface (29') so as to leave other portions (641) of the dielectric (64) in the cavity (631, 631'). According to a yet further embodiment, prior to the step of depositing the dielectric (64), exposed surfaces of the cavity (631') are treated to form an oxide region (421) thereon. According to a still yet further embodiment, the curved dielectric region has a thickness in the range of about 1 to 10 nanometers.

According to a third embodiment, there is provided an antifuse (90, 90') having first and second terminals (34, 34'; 96, 96'), comprising, a substrate (21, 21') having a first surface (29, 29'), a first conductive region (22, 22'; 24, 24'; 31) adjacent the first surface (29, 29') coupled the first terminal (34, 34'), a dielectric region (32, 44) in contact with the first conductive region (22, 22'; 24, 24'; 31), a second conductive region (92, 92') having a first portion (921, 921') overlying the dielectric region (32, 44), a second portion (922) spaced apart from the dielectric region (32, 44) and a third portion (923) spaced apart from the second portion (922), first (27, 27') and second (93, 93') contacts, ohmically coupled to the first portion (921) and third portion (923), respectively, of the second conductive region (92, 92') and to the second terminal (96, 96'), and wherein the second portion (922) of the second conductor provides a higher resistance between the second contact (93, 93') and the dielectric region (32, 44) than between the first contract (27, 27') and the dielectric region (32, 44). According to a further embodiment, the dielectric region (32) is substantially planar. According to a still further embodiment, the dielectric region (44) is curved. According to a yet further embodiment, the dielectric region (44) has a thickness of about 1 to 10 nanometers. According to a still yet further embodiment, the second conductive region (92, 92') is a doped semiconductor and the second portion (922, 922') has lower doping than the first (921. 921') and third (923, 923') portions.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

What is claimed is:

1. A method for forming an antifuse, comprising:
   providing a substrate having an upper surface;
   forming a cavity extending a predetermined distance into the substrate from the upper surface;
   filling the cavity with a dielectric having a central region depressed from the upper surface;
   forming a curved dielectric region on a curved portion of the surface of the substrate adjacent the cavity and extending toward the central region; and
   depositing a conductor having a curved portion overlying the curved dielectric region, thereby forming a breakdown region comprising the curved portion of the conductor and the curved portion of the substrate on either side of the curved dielectric region.

2. The method of claim 1, wherein the curved dielectric region is formed by oxidation of the curved portions the substrate.

3. The method of claim 1, wherein, the filling step comprises depositing a dielectric into the cavity and over the upper surface and then removing portions of the dielectric over the upper surface so as to leave other portions of the dielectric in the cavity.

4. The method of claim 3, wherein prior to the step of depositing the dielectric, exposed surfaces of the cavity are treated to form an oxide region thereon.

5. The method of claim 1, wherein the curved dielectric region has a thickness in a range of about 1 to 10 nanometers.

6. A method for forming an antifuse, comprising:
   providing a semiconductor substrate having an upper surface;
   forming a first dielectric region having a curved lip at the upper surface;
   forming a first conductive region in the substrate on a side of the first dielectric region, the first conductive region having a curved portion underlying the curved lip;
   forming a second conductive region over the first dielectric region and the curved lip, thereby forming, in combination with the curved portion of the first semiconductor region, a curved breakdown region adapted to switch from a substantially non-conductive state to a substantially conductive state in response to a predetermined applied programming voltage; and
   forming a second dielectric region substantially thicker than the first dielectric region located adjacent the first dielectric region;
   wherein the first and second conductive regions are doped semiconductor regions, and wherein the second dielectric region comprises a dielectric filled cavity in the substrate.

7. The method of claim 6, wherein the second conductive region is a substantially polycrystalline semiconductor region, and the first conductive region is a substantially single crystal semiconductor region.

8. The method of claim 6, wherein forming the first and second conductive regions comprises doping the substrate, and forming the first dielectric region comprises oxidizing the substrate.

9. The method of claim 6, wherein the second dielectric region comprises a dielectric formed by chemical vapor deposition.

10. The method of claim 6, where in the second dielectric region comprises a dielectric formed in part by thermal oxidation and in part by deposition.

11. The method of claim 6, wherein the first dielectric region is a thermally grown oxide region.

12. The method of claim 6, wherein the curved lip has a thickness in a range of 1 to 10 nanometers.

13. A method for forming an antifuse having first and second terminals, comprising:
   providing a substrate having a first surface;
   forming a first conductive region adjacent the first surface and coupled to the first terminal;

forming a dielectric region in contact with the first conductive region;

forming a second conductive region having a first portion overlying the dielectric region, a second portion spaced apart from the dielectric region, and a third portion spaced apart from the second portion and the dielectric region;

forming a first contact coupled to the second terminal and ohmically coupled to the first portion of the second conductive region; and forming a second contact coupled to the second terminal and ohmically coupled to the third portion of the second conductive region, wherein the first portion of the second conductive region provides a first resistance between the first contact and the dielectric region, and the second portion of the second conductive region provides a second resistance between the second contact and the dielectric region, wherein the second resistance is higher than the first resistance.

14. The method of claim 13, wherein the dielectric region is substantially planar.

15. The method of claim 13, wherein the dielectric region has a thickness in a range of 1 to 10 nanometers.

16. The method of claim 13, wherein the dielectric region is curved.

17. The method of claim 13, wherein the second conductive region is a doped semiconductor, and the second portion has a lower doping than the first and third portions.

* * * * *